US006998929B1

(12) United States Patent
Adam

(10) Patent No.: US 6,998,929 B1
(45) Date of Patent: Feb. 14, 2006

(54) LOW THRESHOLD POWER FREQUENCY SELECTIVE LIMITER FOR GPS

(75) Inventor: John Douglas Adam, Millersville, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/424,738

(22) Filed: Apr. 29, 2003

(51) Int. Cl.
*H01P 1/218* (2006.01)
*H01P 1/23* (2006.01)

(52) U.S. Cl. .................................... 333/17.2; 333/24.2

(58) Field of Classification Search ............... 333/17.2, 333/24.1–24.3, 1.1
See application file for complete search history.

(56) References Cited

U.S. PATENT DOCUMENTS 3,585,531 A * 6/1971 Degenford et al. .......... 333/1.1
4,488,122 A * 12/1984 Wolkstein ................... 330/149
4,595,889 A * 6/1986 Stitzer et al. ............. 333/17.2
4,675,682 A * 6/1987 Adam et al. ................ 342/375
4,845,439 A * 7/1989 Stitzer et al. ............. 333/17.2
4,980,657 A 12/1990 Stitzer et al. ............. 333/17.2
4,999,593 A * 3/1991 Anderson ................... 333/112
5,023,573 A * 6/1991 Adam ....................... 333/17.2
5,157,360 A * 10/1992 McGann et al. ........... 333/17.2
5,170,137 A * 12/1992 Woermbke et al. ........ 333/17.2
5,955,987 A 9/1999 Murphy et al. ........ 342/357.06
5,985,472 A * 11/1999 Geho et al. ................. 428/692
6,518,862 B1 * 2/2003 Takagi et al. ............... 333/202

* cited by examiner

*Primary Examiner*—Dinh T. Le
(74) *Attorney, Agent, or Firm*—Birch, Stewart, Kolasch & Birch, LLP

(57) ABSTRACT

A frequency selective limiter operative in a magnetostatic surface mode with a pair of parallel microstrip transducers formed on a substrate and having a length at least equal to the width of an overlaying YIG film ranging in thickness from about 0.1 μm and about 5.0 μm and having a width equal to or less than about 20. mm and which is biased by a permanent magnetic field applied in the plane of the film parallel to the transducers so that magnetostatic surface waves propagate therebetween in the YIG film so as to provide a limiter threshold level in the range of −75 dBm to −35 dBm. The transducers have specific spacings and dimensions.

5 Claims, 2 Drawing Sheets

LOW THRESHOLD POWER FREQUENCY SELECTIVE LIMITER FOR GPS

BACKGROUND OF THE INVENTION

1. Field of the Invention

The present invention relates to frequency selective limiters (FSLs) for providing low attenuation to relatively low power RF signals and high attenuation to relatively high power signals above a critical threshold level and more particularly to a magnetostatic wave (MSW) type frequency selective limiter having a threshold level in the range of −75 dBm to −35 dBm.

2. Description of Related Art

In an RF environment, interference signals may have jamming effects on an RF receiving system even though they are not intentionally generated. Jamming interference signals may originate, for example, in a laptop computer on an airplane, a radio or television tower, or any high frequency device such as radar, a radio or cellular telephone. Also jamming signals may be generated by combatants in a military environment or by terrorists in a similar or commercial environment.

Frequency selective limiters (FSLs), also known as power selective limiters (PSLs), are well known in the art for suppressing RF signals in various types of equipment having a need for protection against interference and jamming. In one type of frequency selective limiter, known as a magnetostatic wave limiter, magnetostatic waves propagate in a film of magnetically biased ferrite material such as yttrium iron garnet (YIG) which is grown epitaxially on a substrate. In a magnetostatic surface wave (MSW) device a permanent magnet bias field is oriented perpendicularly to the direction of the wave propagation in the plane of the film wherein energy concentrations are bound to the top surface of the epitaxial film in a forward going wave mode and to the bottom surface of the film at a single reverse going wave mode. This principle is well documented in the art.

Frequency selective limiters are known to have particular applicability in radio frequency systems used, for example, for navigational purposes and, more particularly, to receivers which operate in satellite navigation systems such as the well known Global Positioning System (GPS). One such example is disclosed in U.S. Pat. No. 5,955,987, entitled, "Hybrid Radio Frequency System With Distributed Anti-Jam Capabilities For Navigation Use", issued to John H. Murphy et al. on Sep. 21, 1999, and which is assigned to the assignee of the present invention. The contents of this patent are herein incorporated in their entirety by reference for any and all purposes.

The Murphy et al. patent discloses, among other things, an adaptive RF filter based on YIG filter technology and discloses a magnetostatic wave (MSW) structure as shown in FIG. 1 of this application. As shown in FIG. 1, a thin film of yttrium iron garnet (YIG) 12 is located transversely across a pair of input and output stripline conductors 14 and 16 which are known in the art as transducers. When appropriately biased by an external magnetic field 18, the structure functions as a signal delay line having a variable impedance which utilizes a spin wave to absorb excess energy above a threshold value from signals applied to the input transducer, i.e., the stripline conductor 14. The threshold is tunable and is a function of the thickness dimension (a) of the YIG film 12. The frequency selective device 10 operates as a frequency or, more precisely, a power selective limiter and has found application not only in GPS systems where jammer-free and interference-free operation is required with respect to an RF receiver, but also on other types of airborne vehicles as well as surface vehicles or other platforms for the computation of the platform position.

GPS systems typically include a frequency selective limiter (FSL) 20, as shown in FIG. 2 between the front end of a GPS receiver 22 and a receiving antenna 24 which may or may not also include a low noise RF amplifier 26. Present FSLs have a threshold power level of approximately −25 dBm. However, because of the extremely low power levels of the received GPS signal, significant gain (>60 dB) is required to bring the GPS signal plus interference into a power range where the large interfering signal can be selectively attenuated. The amplifiers require significant power and the high gain can lead to instability in compact/integrated designs. FSLs with threshold power levels in the −75 dBm to −35 dBm range would eliminate or significantly reduce the required amplifier gain and power.

SUMMARY

Accordingly, it is an object of the present invention, therefore, to suppress interference and jamming in radio frequency systems such as navigation systems.

It is another object of the present invention to provide an improvement in power frequency selective limiters for receivers in global positioning systems such as GPS systems.

It is a further object of the invention to provide a relatively low threshold power frequency selective limiter for GPS receiver.

Still another object of the invention is to provide a frequency selective limiter having threshold power in the range of −75 dBm to −35 dBm.

The foregoing and other objects are achieved by a power frequency selective limiting structure operative in a magnetostatic surface wave mode with a pair of parallel microstrip transducers formed on a substrate with an overlaying YIG film which is about 1.0 μm or less and which is biased by a permanent magnetic field applied in the plane of the film parallel to the transducers so that magnetostatic surface waves propagate therebetween in the YIG film.

In one aspect of the invention, there is provided a relatively low threshold magnetostatic surface wave frequency selective limiter, comprising: a substrate; a pair of input and output RF signal transducers and associated impedance matching networks connected to respective input and output signal terminals located on the substrate; an epitaxial YIG film ranging in thickness between about 0.1 μm and 5.0 μm located over the pair of input and output transducers; and means providing a magnetic bias field applied in a plane of the YIG film parallel to the transducers so that magnetostatic surface waves propagate from one of the transducers to the other transducer upon the application of an RF signal to the input signal terminal.

In another aspect of the invention, there is provided a relatively low threshold magnetostatic surface wave frequency selective limiter, comprising: a substrate; a pair of mutually parallel input and output microstrip transducers and associated impedance matching networks located on the substrate and connected to respective input and output signal terminals; an epitaxial YIG film ranging in thickness between about 0.1 μmm and 5.0 μm and having a width equal to or less than about 2 mm located over the pair of microstrip transducers, the microstrip transducers having a length at least equal to the width of the YIG film and a mutual separation ranging between 0.25 mm and about 3.0 mm so as to provide an input to output isolation of at least 50 dB; and, means providing a permanent magnetic bias field in a plane of the YIG film parallel to the transducers. The input and output transducers are designed so as to have a resistance equal to or less than about 0.01 ohm, and the impedance matching networks are designed so as to provide a Q equal to or greater than about 100.

Further scope of applicability of the present invention will become apparent from the detailed description provided hereinafter. However, it should be understood that the detailed description and specific example, while indicating the preferred embodiment of the invention, is provided by way of illustration only, since various changes and modifications coming within the spirit and scope of the invention will become apparent to those skilled in the art from the detailed description.

BRIEF DESCRIPTION OF THE DRAWINGS

The present invention will become more fully understood from the detailed description provided hereinafter and the accompanying drawings which are not necessarily to scale and are provided by way of illustration only, and wherein.

DETAILED DESCRIPTION OF THE INVENTION

As is well known, a GPS frequency selective limiter (FSL), also known as a power selective limiter (PSL), makes use of the non-linear excitation of magnetostatic surface waves in an appropriately magnetized YIG film. Microwave signals coupled into the YIG film produce an essentially linear response at low signal levels. Insertion loss is relatively small with a wide operating bandwidth; however, above a critical RF field strength, referred to as the threshold power level, the precession of the magnetic dipole that is generated within the YIG film become strong enough to overcome its natural losses, and energy begins to transfer exponentially to shorter wavelength subharmonic spin waves. These "half frequency" spin waves readily transfer energy to the crystal lattice, whereby the excess RF power above the threshold value is dissipated as heat in the ferrite, thereby creating a non-linear absorption notch filter. This non-linear coupling takes place in a bandwidth on the order of the spinwave bandwidth (<2 MHz). Weak signals outside of this power domain absorption notch formed by the subharmonic spin waves will undergo less than 1 dB attenuation above the weak signal insertion loss.

In a GPS environment, all satellite signals and any jammer signals are very weak. Satellite signals typically have coupled power levels of −133 dBm, with jamming beginning at −75 dBm. Typical state of the art devices have a limiting threshold in the range of −23 dBm to −25 dBm and hence better than 50 dB of gain is required to "lift" jammers into a limiting range. This amount of gain in the front end of a low noise receiver, however, is undesirable.

Figure 1:
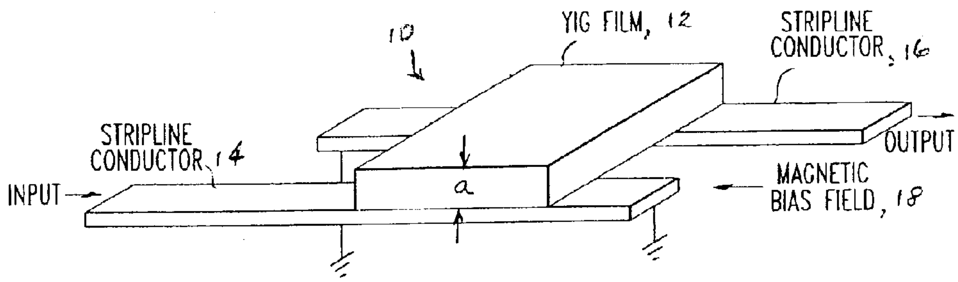
FIG. 1 is a perspective view generally illustrative of the basic structural features of a magnetostatic wave type of frequency selective limiter.
Figure 2:
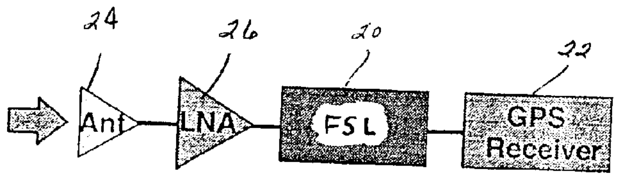
FIG. 2 is an electrical block diagram illustrative of a frequency selective limiter utilized in connection with a GPS receiver.
Figure 3:
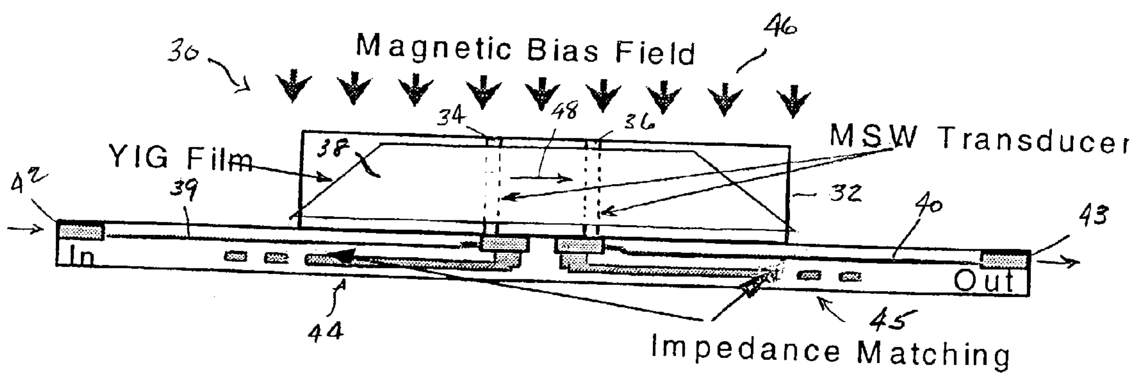
FIG. 3 is a top plan view generally illustrative of one known implementation of a frequency selective limiter used in connection with GPS apparatus.

A known state of the art frequency selective limiter for GPS applications is shown, for example, at FIG. 3. Shown thereat is a FSL device 30 including a substrate 32 consisting of, for example, gadolinium-gallium garnet (GGG) over which a YIG film 38 is epitaxially grown. A pair of parallel MSW transducers 34 and 36 in the form of stripline conductors are formed on a suitable dielectric substrate, e.g. alumina. The transducers 34 and 36 are connected to input and output signal leads 39 and 40 which terminate in signal couplers 42 and 43. Also included in the device are a pair of impedance matching networks 44 and 45 associated with the input and output signal lines 39 and 40.

The YIG film 38 is also shown with its opposite ends cut at an angle to prevent reflection of magnetostatic waves. Further as shown in FIG. 3, a magnetic bias field 46 is applied in the plane of the YIG film 38 and perpendicular to the direction of wave propagation as shown by reference numeral 48 between the parallel transducers 34 and 36. In the embodiment of the device 30 shown in FIG. 3, the YIG film is typically 20 um thick, 25 mm long, and 5 mm wide. The transducers 34 and 36 are about 2.0 mm in length, 0.1 mm in width and have a mutual separation of 5 mm.

Figure 4:
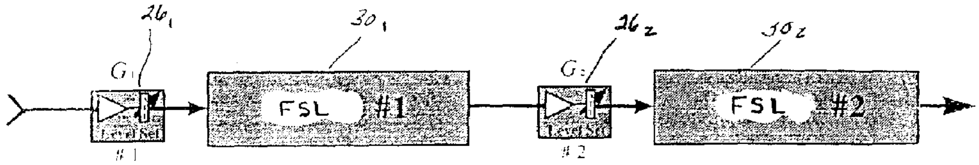
FIG. 4 is an electrical block diagram illustrative of a configuration of a pair of frequency selective limiters connected in series.
Figure 5:
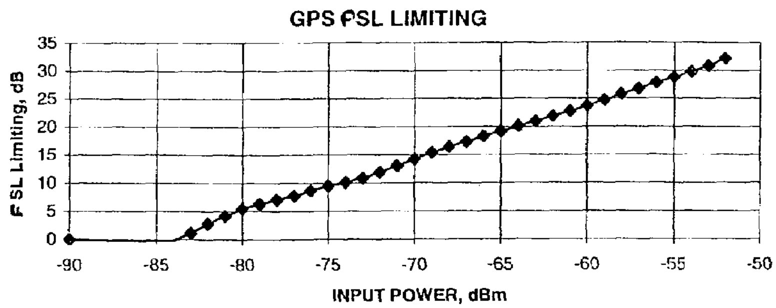
FIG. 5 is a graphical illustration of the relationship between input power and the FSL limiting threshold of the configuration shown in FIG. 4.

In order to increase or expand the dynamic range of the threshold below −25 dBm, for example, tests were performed on a two stage frequency selective limiter (FSL) configuration as shown in FIG. 4 which included a pair of FSLs $\mathbf{30}_1$, and $\mathbf{30}_2$ including the associated input amplifiers $\mathbf{26}_1$ and $\mathbf{26}_2$. The limiting threshold here is lowered by the 60 dB gain of the amplifier. The threshold power of the FSL was unchanged at −25 dBm. The results indicated that a limiting threshold value could be reduced to almost −85 dBm as shown by the graph of PSL limiting vs. VS input power as shown in FIG. 5. It can further be seen as illustrated in FIG. 6 that the threshold power level decreases with decreasing film thickness of a YIG film.

The limiting threshold occurs at a critical value of RF magnetization $m_{crit}$ in the YIG, which corresponds to a critical energy density $U_{crit}$. The power $P_{crit}$ transmitted through a MSW device such as shown in FIG. 3 is given by $P_{crit}=U_{crit}$x $v_g$, where $v_g$ is the group velocity. The group velocity is proportional to the YIG film thickness and the energy density, for a given input power level, is inversely proportional to the cross-sectional area of the film so that, for a constant width film $P_{crit}\ \alpha\ d^2$. If the thickness to width ratio of the film is held constant, then $P_{crit}\ \alpha\ d^3$. The result of measurements of the threshold power level as function of YIG film thickness are shown in FIG. 6. These measurements were performed on an unmatched YIG test fixture, thus the threshold values do not correspond to the −23 dBm measured in a FSL device. Note that the variation of threshold power level is in close agreement with the $d^2$ dependence except for the thickest film.

Figure 6:
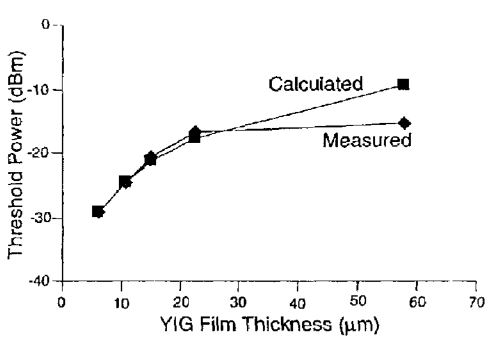
FIG. 6 is a graphical illustration of the relationship between YIG film thickness and threshold power.
Figure 7:
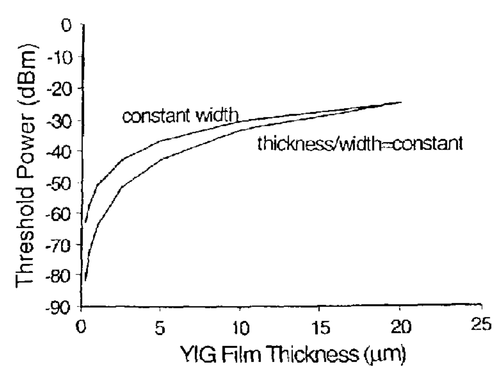
FIG. 7 is a graphical illustration further illustrative of the relationship of YIG film thickness to threshold power.

Noting that threshold power levels in FSLs are a function of YIG thickness, FIGS. 6 and 7 indicate that a YIG film thickness of less than 5 microns can achieve a threshold power level in the range between −75 dBM and −35 dBm.

It should also be noted that the radiation resistance of MSW transducers such as transducers 34 and 36 shown in FIG. 3 also decrease with decreasing YIG film thickness and width.

Figure 8A:
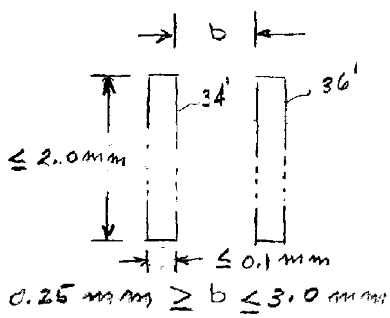
FIGS. 8A and 8B are illustrative of the physical dimensions of the preferred embodiment of the subject invention.
Figure 8B:
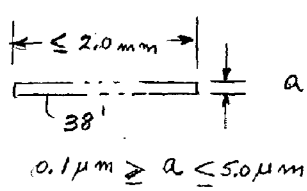

Considering now the inventive concept of this invention, which is shown in FIGS. 8A and 8B, if it is assumed that 5 mm long stripline transducers 34, 36 and a 20 $\mu$m thick YIG film shown in FIG. 3 provides approximately 50 ohm resistive input impedance, the input resistance of microstrip transducers 34' and 36' can be made extremely small where the transducers have a width equal to or less than 0.1 mm and a length equal to or less than the width of the YIG film 38' which is equal to or less than 2.0 mm and has a thickness ranging between about 0.1 $\mu$m and 5.0 $\mu$m. For example, microstrip transducers 34' and 36' in accordance with a preferred embodiment of the invention which are equal to or less than 1.0 mm long and less than 0.1 mm wide and used together with a YIG film 38' less than 1 $\mu$m thick and having a width less than 1 mm can produce an input resistance as low as 0.1 ohm.

As the thickness of the YIG film is reduced, it must be scaled in length proportionately in order to maintain the same group delay and minimize MSW propagation losses. This therefore requires an input to output transducer separation distance (b) of the microstrip transducers 34' and 36' shown in FIG. 8A to be in the range of 0.25 mm to about 3 mm for a YIG film 38' shown in FIG. 8B and having a thickness (a) ranging between about 0.1 $\mu$m and 5.0 $\mu$m, typically less than 1.0 $\mu$m, and having a width equal to or less than about 2.0 mm so as to provide an input to output isolation of at least 50 dB.

The input and output transducers 34' and 36' must also be designed to have an equivalent RF series resistance less than 0.01 ohms to avoid excess transducer loss. Efficient transformation of such a low resistance to 50 ohms requires low loss impedance matching circuits 44 and 45 (FIG. 3) with Qs equal to or greater than 100. These high Q values are close to the practical limit for compact lumped elements or microstrip circuits. It should also be noted, however, that dielectric resonator matching circuits are potential low loss alternatives and can be utilized when desired.

Thus what has been shown and described is an improved frequency selective limiter that exhibits threshold power levels in the −75 dBm to −35 dBm range and thus enabling their use in GPS receivers without the prime power and sensitivity penalties incurred with present FSL devices having a threshold in the order of −25 dBm.

What is claimed is:

1. A relatively low threshold magneto static surface wave frequency selective limiter, comprising:

a substrate;

a pair of mutually parallel input and output microstrip transducers and associated impedance matching networks connected to respective input and output signal terminals located on the substrate;

an epitaxial YIG film ranging in thickness between about 0.1 $\mu$m and 5.0 $\mu$m and having a width equal to or less than about 2.0 mm located over the pair of input and output transducers;

the transducers having a length at least equal to the width of the YIG film and a mutual separation ranging between 0.25 mm and about 3.0 mm so as to provide an input to output isolation of at least 50 dB; and, means providing a magnetic bias field applied in a plane of the YIG film parallel to the transducers so that magnetostatic surface waves propagate from one of the transducers to the other transducer upon the application of an RF signal to the input signal terminal.

2. The frequency selective limiter according to claim 1 wherein the input and output transducers are designed so as to have a resistance equal to or less than about 0.01 ohm.

3. The frequency selective limiter according to claim 2 wherein the transducers have a length equal to or less than 2.0 mm and a width equal to or less than 0.1 mm.

4. The frequency selective limiter according to claim 1 wherein the impedance matching networks are designed so as to provide a Q equal to or greater than about 100.

5. A relatively low threshold magnetostatic surface wave frequency selective limiter, comprising:

a substrate;

a pair of mutually parallel input and output microstrip transducers and associated impedance matching networks connected to respective input and output signal terminals located on the substrate;

an epitaxial YIG film having a thickness ranging between 0.1 $\mu$m and 5.0 $\mu$m and having a width equal to or less than about 2.0 mm located over the pair of input and output transducers;

the transducers having a length at least equal to or less than 1.0 mm and a width less than 0.1 mm so as to provide an input to output isolation of at least 50 dB; and, means providing a magnetic bias field applied in a plane of the YIG film parallel to the transducers so that magnetostatic surface waves propagate from one of the transducers to the other transducer upon the application of an RF signal to the input signal terminal.

* * * * *